United States Patent
Kweon et al.

(10) Patent No.: US 10,083,931 B2
(45) Date of Patent: Sep. 25, 2018

(54) PACKAGED MICROELECTRONIC DEVICES HAVING STACKED INTERCONNECT ELEMENTS AND METHODS FOR MANUFACTURING THE SAME

(71) Applicant: Micron Technology, Inc., Boise, ID (US)

(72) Inventors: Young Do Kweon, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/964,096

(22) Filed: Dec. 9, 2015

(65) Prior Publication Data

US 2016/0086910 A1 Mar. 24, 2016

Related U.S. Application Data

(62) Division of application No. 14/583,984, filed on Dec. 29, 2014, now Pat. No. 9,240,385, which is a division
(Continued)

(51) Int. Cl.
*H01L 23/00* (2006.01)
*H01L 21/78* (2006.01)
(Continued)

(52) U.S. Cl.
CPC ........ *H01L 24/742* (2013.01); *H01L 21/4853* (2013.01); *H01L 21/566* (2013.01);
(Continued)

(58) Field of Classification Search
CPC ....... H01L 24/11; H01L 24/12; H01L 24/742; H01L 23/49816; H01L 23/3114;
(Continued)

(56) References Cited

U.S. PATENT DOCUMENTS

| | | | | |
|---|---|---|---|---|
| 4,997,122 A | * | 3/1991 | Zimmer | B23K 1/0004 228/165 |
| 5,252,857 A | | 10/1993 | Kane et al. | |

(Continued)

FOREIGN PATENT DOCUMENTS

| | | |
|---|---|---|
| JP | 2004119544 A | 4/2004 |
| KR | 20040057640 A | 7/2004 |

OTHER PUBLICATIONS

Bijnen, F.G.C., et al., Back-side alignment strategy decouples process from alignment and achieves leading edge overlay performance, Microelectronic Engineering 83 (2006) 647-650.
(Continued)

*Primary Examiner* — Mohsen Ahmadi
(74) *Attorney, Agent, or Firm* — Perkins Coie LLP

(57) ABSTRACT

Microelectronic devices and method of forming a plurality of microelectronic devices on a semiconductor workpiece are disclosed herein. One such method includes placing a plurality of first interconnect elements on a side of a semiconductor workpiece, forming a layer on the side of the workpiece, reshaping the first interconnect elements by heating the first interconnect elements, and coupling a first portion of a plurality of individual second interconnect elements to corresponding first interconnect elements with a second portion of the individual second interconnect elements exposed.

9 Claims, 10 Drawing Sheets

Related U.S. Application Data of application No. 12/796,011, filed on Jun. 8, 2010, now Pat. No. 8,922,002, which is a division of application No. 11/509,441, filed on Aug. 23, 2006, now Pat. No. 7,749,882.

(51) Int. Cl.
  *H01L 23/544* (2006.01)
  *H01L 21/48* (2006.01)
  *H01L 23/31* (2006.01)
  *H01L 23/498* (2006.01)
  *H01L 21/56* (2006.01)

(52) U.S. Cl.
  CPC .......... *H01L 21/78* (2013.01); *H01L 23/3114* (2013.01); *H01L 23/49816* (2013.01); *H01L 23/544* (2013.01); *H01L 24/11* (2013.01); *H01L 24/12* (2013.01); *H01L 24/14* (2013.01); *H01L 24/18* (2013.01); *H01L 24/81* (2013.01); *H01L 24/94* (2013.01); *H01L 21/563* (2013.01); *H01L 2223/54426* (2013.01); *H01L 2223/54453* (2013.01); *H01L 2223/54486* (2013.01); *H01L 2224/05001* (2013.01); *H01L 2224/05008* (2013.01); *H01L 2224/05026* (2013.01); *H01L 2224/0557* (2013.01); *H01L 2224/05569* (2013.01); *H01L 2224/05571* (2013.01); *H01L 2224/11013* (2013.01); *H01L 2224/11015* (2013.01); *H01L 2224/1183* (2013.01); *H01L 2224/1184* (2013.01); *H01L 2224/13022* (2013.01); *H01L 2224/13099* (2013.01); *H01L 2224/16* (2013.01); *H01L 2224/274* (2013.01); *H01L 2224/7598* (2013.01); *H01L 2924/00013* (2013.01); *H01L 2924/00014* (2013.01); *H01L 2924/014* (2013.01); *H01L 2924/01005* (2013.01); *H01L 2924/01006* (2013.01); *H01L 2924/01018* (2013.01); *H01L 2924/01033* (2013.01); *H01L 2924/01082* (2013.01); *H01L 2924/12042* (2013.01); *H01L 2924/14* (2013.01); *H01L 2924/181* (2013.01); *H01L 2924/384* (2013.01)

(58) Field of Classification Search
  CPC . H01L 23/544; H01L 21/4853; H01L 21/566; H01L 21/78
  See application file for complete search history.

(56) References Cited

U.S. PATENT DOCUMENTS

| | | | |
|---|---|---|---|
| 5,677,566 A | 10/1997 | King et al. | |
| 5,851,845 A | 12/1998 | Wood et al. | |
| 5,925,930 A | 7/1999 | Farnworth et al. | |
| 5,929,521 A | 7/1999 | Wark et al. | |
| 5,933,713 A * | 8/1999 | Farnworth | H01L 21/563 257/E21.503 |
| 5,946,553 A | 8/1999 | Wood et al. | |
| 6,004,867 A | 12/1999 | Kim et al. | |
| 6,008,070 A | 12/1999 | Farnworth | |
| 6,020,624 A | 2/2000 | Wood et al. | |
| 6,048,755 A | 4/2000 | Jiang et al. | |
| 6,072,233 A | 6/2000 | Corisis et al. | |
| 6,072,236 A | 6/2000 | Akram et al. | |
| 6,081,429 A | 6/2000 | Barrett | |
| 6,097,087 A | 8/2000 | Farnworth et al. | |
| 6,107,122 A | 8/2000 | Wood et al. | |
| 6,124,634 A | 9/2000 | Akram et al. | |
| 6,184,465 B1 | 2/2001 | Corisis | |
| 6,187,615 B1 | 2/2001 | Kim et al. | |
| 6,204,558 B1 | 3/2001 | Yanagida | |
| 6,228,687 B1 | 5/2001 | Akram et al. | |
| 6,235,552 B1 | 5/2001 | Kwon et al. | |
| 6,281,577 B1 | 8/2001 | Oppermann et al. | |
| 6,310,390 B1 | 10/2001 | Moden | |
| 6,326,697 B1 | 12/2001 | Farnworth | |
| 6,326,698 B1 | 12/2001 | Akram | |
| 6,329,222 B1 | 12/2001 | Corisis et al. | |
| 6,407,381 B1 | 6/2002 | Glenn et al. | |
| 6,503,780 B1 | 1/2003 | Glenn et al. | |
| 6,552,910 B1 | 4/2003 | Moon et al. | |
| 6,560,117 B2 | 5/2003 | Moon et al. | |
| 6,576,531 B2 | 6/2003 | Peng et al. | |
| 6,740,546 B2 | 5/2004 | Corisis et al. | |
| 6,756,184 B2 * | 6/2004 | Peng | H01L 24/11 228/180.21 |
| 6,827,252 B2 * | 12/2004 | Tong | B23K 1/0016 228/180.1 |
| 6,924,550 B2 | 8/2005 | Corisis et al. | |
| 7,042,088 B2 | 5/2006 | Ho | |
| 7,202,569 B2 * | 4/2007 | Tomono | H01L 21/563 257/734 |
| 2002/0061665 A1 | 5/2002 | Batinovich et al. | |
| 2003/0214029 A1 | 11/2003 | Tao et al. | |
| 2004/0113283 A1* | 6/2004 | Farnworth | H01L 21/3043 257/782 |
| 2005/0059217 A1 | 3/2005 | Morrow et al. | |
| 2007/0029674 A1 | 2/2007 | Shin et al. | |
| 2007/0132077 A1 | 6/2007 | Choi et al. | |
| 2007/0262436 A1* | 11/2007 | Kweon | H01L 21/561 257/686 |
| 2008/0050901 A1 | 2/2008 | Kweon et al. | |
| 2010/0237494 A1 | 9/2010 | Kweon et al. | |
| 2015/0118796 A1 | 4/2015 | Kweon et al. | |

OTHER PUBLICATIONS

Lee et al., "Application of Back-side Alignment of Thick Layers for the Manufacturing of Advanced Power Devices" IEEE/SEMI ASMC (2006) pp. 104-107.

* cited by examiner

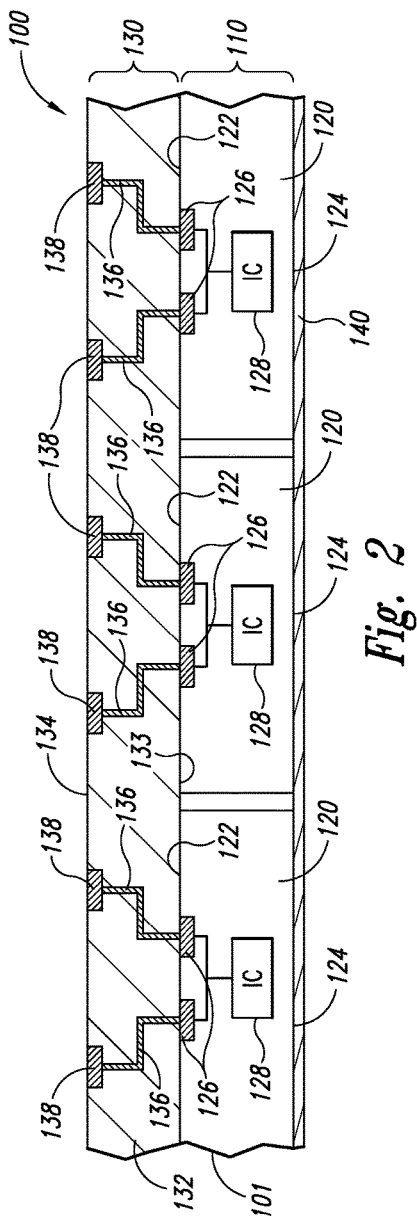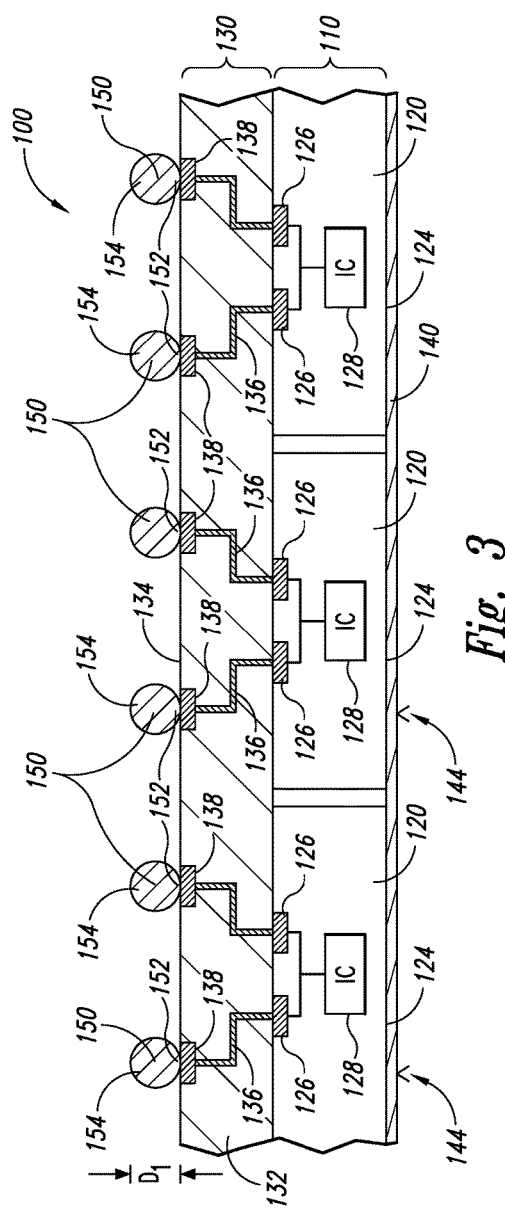

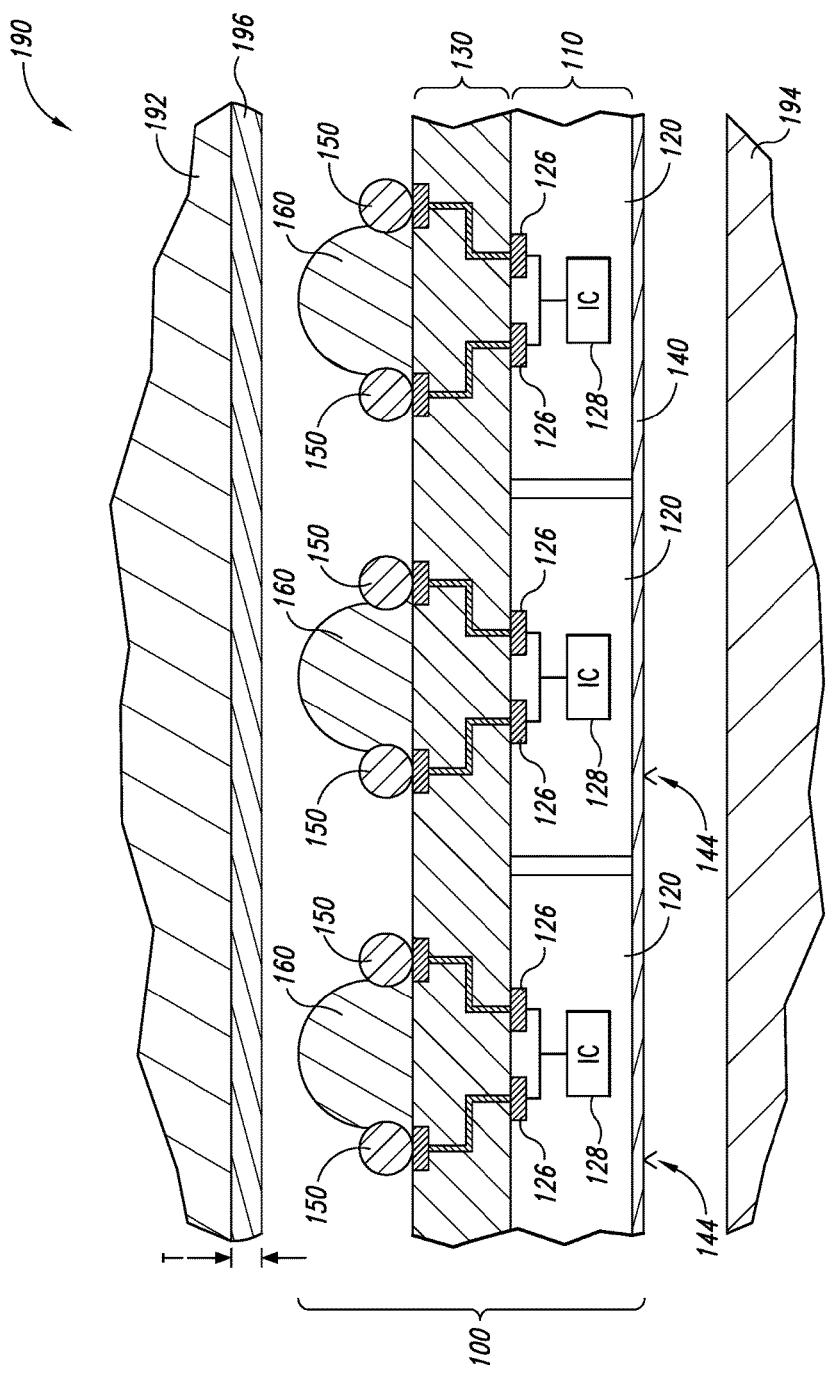

PACKAGED MICROELECTRONIC DEVICES HAVING STACKED INTERCONNECT ELEMENTS AND METHODS FOR MANUFACTURING THE SAME

CROSS-REFERENCE TO RELATED APPLICATIONS

This application is a divisional of U.S. application Ser. No. 14/583,984 filed Dec. 29, 2014, which is a divisional of U.S. application Ser. No. 12/796,011 filed Jun. 8, 2010, now U.S. Pat. No. 8,922,002, which is a divisional of U.S. application Ser. No. 11/509,441 filed Aug. 23, 2006, now U.S. Pat. No. 7,749,882, each of which is incorporated herein by reference in its entirety.

TECHNICAL FIELD

The present disclosure is related to packaged microelectronic devices and methods for manufacturing packaged microelectronic devices.

BACKGROUND

Processors, memory devices, imagers and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond-pads coupled to the integrated circuit. The bond-pads provide external electrical contacts on the die through which supply voltage, signals, etc., are transmitted to and from the integrated circuit. The bond-pads are usually very small, and they are arranged in an array having a fine pitch between bond-pads. The dies can also be quite delicate. As a result, after fabricating the dies, they are packaged to protect the dies and to connect the bond-pads to another array of larger terminals that is easier to connect to a printed circuit board. The dies can be packaged after cutting the workpiece to separate the dies (die-level packaging), or the dies can be packaged before cutting the workpiece (wafer-level packaging).

Conventional die-level packaged microelectronic devices include a microelectronic die, an interposer substrate or lead frame attached to the die, and a molded casing around the die. The bond-pads of the die are typically coupled to terminals on the interposer substrate or the lead frame. In addition to the terminals, the interposer substrate also includes ball-pads coupled to the terminals by conductive traces supported in a dielectric material. Solder balls can be attached to the ball-pads in one-to-one correspondence to form a "ball-grid array." Packaged microelectronic devices with ball-grid arrays are generally higher grade packages having lower profiles and higher pin counts than conventional packages using lead frames.

One process for die-level packaging includes (a) forming a plurality of dies on a semiconductor wafer, (b) cutting the wafer to separate or singulate the dies, (c) attaching individual dies to an interposer substrate, (d) wire-bonding the bond-pads of the dies to the terminals of the interposer substrate, and (e) encapsulating the dies with a suitable molding compound. Mounting individual dies to interposer substrates or lead frames in the foregoing manner can be a time-consuming and expensive process. In addition, forming robust wire-bonds that can withstand the forces involved in molding processes becomes more difficult as the demand for higher pin counts and smaller packages increases. The process of attaching individual dies to interposer substrates or lead frames may also damage the bare dies. These difficulties have made the packaging process a significant factor in the production of microelectronic devices.

Wafer-level packaging is another process for packaging microelectronic devices in which a redistribution layer is formed over the dies before singulating the dies from the workpiece. The redistribution layer can include a dielectric layer and a plurality of exposed pads formed in arrays on the dielectric layer. Each pad array is typically arranged over a corresponding die, and the pads in each array are coupled to corresponding bond-pads of the die by conductive traces extending through the dielectric layer. After constructing the redistribution layer on the wafer, discrete masses of solder paste can be deposited onto the individual pads. The solder paste is then reflowed to form small solder balls or "solder bumps" on the pads. After forming the solder balls, the wafer is singulated to separate the microelectronic devices, and the individual devices can be attached to printed circuit boards or other substrates.

Wafer-level packaging is a promising development for increasing efficiency and reducing the cost of microelectronic devices because individual dies are effectively "pre-packaged" with a redistribution layer before cutting the wafers to singulate the dies. This enables the use of sophisticated semiconductor processing techniques to form smaller arrays of solder balls. Additionally, wafer-level packaging is an efficient process that simultaneously packages a plurality of dies, thereby reducing costs and increasing throughput.

One drawback of conventional wafer-level packaged devices is that the solder joints between the microelectronic device and substrate are generally quite small and have a relatively short life. Specifically, the microelectronic device and the substrate have different coefficients of thermal expansion, and the microelectronic device generates heat during operation. As a result, the microelectronic device and the substrate expand at different rates during operation, which creates stress on the solder joints. This thermal cycling can cause the small solder joints to fail after relatively few cycles.

One existing approach to increase the life of the solder joints includes constructing a stack of two solder balls on each pad of the redistribution layer. The stack of two solder balls increases the length of the solder ball connection and, consequently, the life of the solder joint. Specifically, this method includes forming a plurality of first solder balls on corresponding pads of the redistribution layer, printing a mold compound onto the redistribution layer, and curing the mold compound. During curing, however, the mold compound wicks up and covers the first solder balls. As a result, the method further includes grinding the cured mold material and a portion of the first solder balls to expose a section of the first solder balls, and then placing a plurality of second solder balls on corresponding first solder balls. The wafer may include open spaces with alignment marks to assist in aligning the second solder balls with the first solder balls.

One problem with this approach, however, is that the grinding process scratches the first solder balls and may adversely affect the structural integrity of the balls and the connection between the first and second solder balls. Another problem with this approach is that the tooling must be modified to form the open spaces and alignment marks on the wafer each time a different device is constructed. If the open spaces and alignment marks are not formed on the wafer, the second solder balls may not be accurately aligned with the first solder balls. Accordingly, there is a need to improve the wafer-level packaging process.

BRIEF DESCRIPTION OF THE DRAWINGS

FIGS. 1-7 illustrate stages in a method for manufacturing a plurality of microelectronic devices in accordance with one embodiment of the invention.

FIG. 1 is a schematic top plan view of a semiconductor workpiece.

FIG. 2 is a schematic side cross-sectional view of a portion of the semiconductor workpiece illustrated in FIG. 1.

FIG. 3 is a schematic side cross-sectional view of the portion of the semiconductor workpiece after forming a plurality of first alignment marks on the protective film.

FIG. 4 is a schematic side cross-sectional view of the portion of the semiconductor workpiece after depositing discrete volumes of mold compound onto the redistribution structure.

FIG. 5 is a schematic side cross-sectional view of the portion of the workpiece and the molding apparatus after clamping the workpiece with the first and second mold portions.

FIG. 6 is a schematic side cross-sectional view of the portion of the semiconductor workpiece after removing the workpiece from the molding apparatus.

FIG. 7 is a schematic side cross-sectional view of the portion of the semiconductor workpiece after forming a plurality of second interconnect elements on corresponding first interconnect elements.

DETAILED DESCRIPTION

Specific details of several embodiments are described below with reference to microelectronic devices including microelectronic dies and a redistribution layer over the dies, but in other embodiments the microelectronic devices may not include the redistribution layer and/or can include other components. For example, the microelectronic devices can include micromechanical components, data storage elements, optics, read/write components, or other features. The microelectronic dies can be SRAM, DRAM (e.g., DDR-SDRAM), flash-memory (e.g., NAND flash-memory), processors, imagers and other types of devices. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-11.

Figure 1:
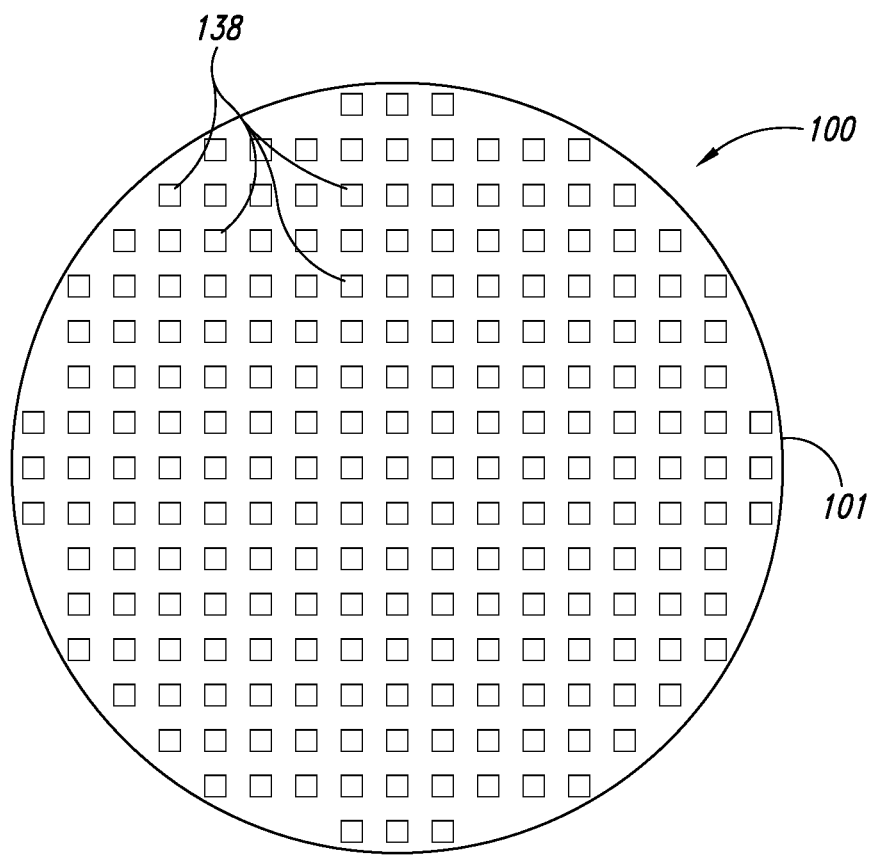

FIGS. 1-7 illustrate stages in a method for manufacturing a plurality of microelectronic devices in accordance with one embodiment of the invention. For example, FIG. 1 is schematic top plan view of a semiconductor workpiece 100, and FIG. 2 is a schematic side cross-sectional view of a portion of the semiconductor workpiece 100. The illustrated semiconductor workpiece 100 is a wafer 101 in and on which devices are constructed. Specifically, referring only to FIG. 2, the workpiece 100 includes a substrate 110 and a plurality of microelectronic dies 120 formed in and/or on the substrate 110. The individual dies 120 include an active side 122, a backside 124 opposite the active side 122, a plurality of terminals 126 (e.g., bond-pads) at the active side 122, and an integrated circuit 128 (shown schematically) operably coupled to the terminals 126. Although the illustrated dies 120 have the same structure, in other embodiments the dies 120 can have different features to perform different functions.

The illustrated semiconductor workpiece 100 further includes a redistribution structure 130 formed on the substrate 110. The redistribution structure 130 includes a dielectric layer 132, a plurality of traces 136 in the dielectric layer 132, and a plurality of terminals 138 in and/or on the dielectric layer 132. The dielectric layer 132 includes a first surface 133 facing the active sides 122 of the dies 120 and a second surface 134 opposite the first surface 133. The terminals 138 are exposed at the second surface 134 of the dielectric layer 132 and electrically coupled to corresponding terminals 126 on the dies 120 via associated traces 136. In other embodiments, such as the embodiment described below with reference to FIG. 9, the semiconductor workpiece 100 may not include the redistribution structure 130.

The semiconductor workpiece 100 can further include an optional protective film 140 on the backsides 124 of the dies 120. The protective film 140 can be a polyimide material or other suitable material for protecting the backsides 124 of the dies 120 during processing of the workpiece 100. In several embodiments, the protective film 140 can be placed on the workpiece 100 before constructing the redistribution structure 130. In other embodiments, the workpiece 100 may not include the protective film 140.

FIG. 3 is a schematic side cross-sectional view of the portion of the semiconductor workpiece 100 after forming a plurality of optional first alignment marks 144 (shown schematically) on the protective film 140. The illustrated first alignment marks 144 are located relative to the specific position of one or more components on the workpiece 100 to provide a reference point for the specific position of the components(s) from the backside of the workpiece 100. For example, the first alignment marks 144 can indicate the position of the terminals 138 on the workpiece 100 from the backside. The first alignment marks 144 accordingly facilitate proper alignment of the workpiece 100 for subsequent processing. The first alignment marks 144 can be formed by laser drilling or other suitable processes to form a mark or other feature on the workpiece 100. In other embodiments, the workpiece 100 may not include alignment marks on the protective layer 140.

After marking the protective film 140, a plurality of conductive first interconnect elements 150 are formed on corresponding terminals 138 of the redistribution structure 130. The first interconnect elements 150 can be solder balls or other conductive members that project from the second surface 134 of the redistribution structure 130. In one specific embodiment which is not limiting, the individual first interconnect elements 150 project a distance $D_1$ of approximately 270 μm from the redistribution structure 130. However, in other embodiments, the first interconnect elements 150 can project a distance greater than or less than 270 μm. In either case, the individual first interconnect elements 150 include a proximal portion 152 at the corresponding terminal 138 and a distal portion 154 opposite the proximal portion 152.

FIG. 4 is a schematic side cross-sectional view of the portion of the semiconductor workpiece 100 after depositing discrete volumes of mold compound 160 onto the redistribution structure 130. The illustrated volumes of mold compound 160 are deposited at corresponding arrays of first interconnect elements 150; however, in other embodiments, a single volume or multiple volumes of mold compound 160 can be placed anywhere on the redistribution structure 130. After depositing the mold compound 160, the workpiece 100 is positioned in a molding apparatus 190 that includes a first mold portion 192, a second mold portion 194, and a release tape 196 attached to the first mold portion 192. The release tape 196 can be a compressible member having a thickness T of approximately 100 μm or another suitable thickness. In the illustrated embodiment, the mold compound 160 is placed onto the workpiece 100 before clamping the workpiece 100 with the first and second mold portions 192 and 194. In other embodiments, however, the first and second mold portions 192 and 194 can clamp the workpiece 100 and then the mold compound 160 can flow onto the workpiece 100.

Figure 5:
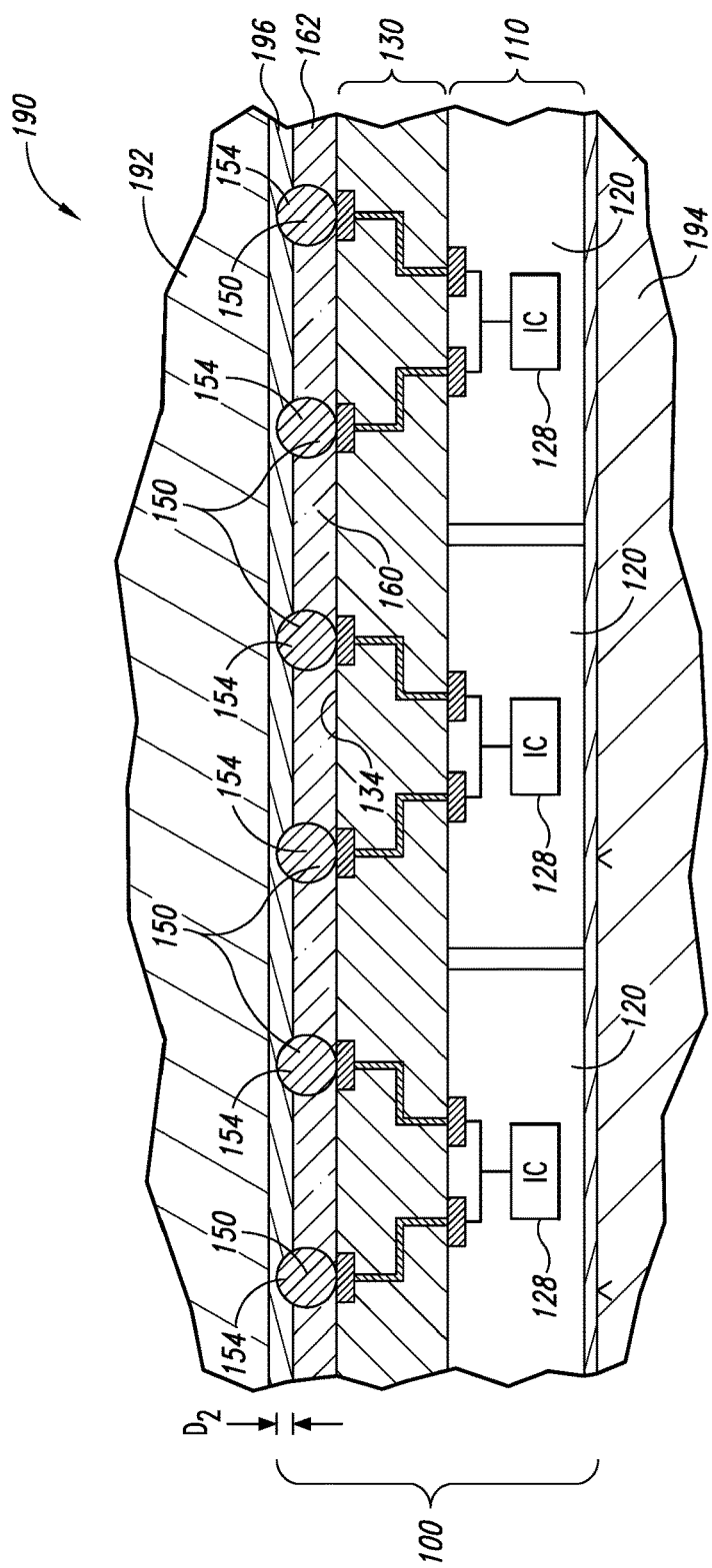

FIG. 5 is a schematic side cross-sectional view of the portion of the workpiece 100 and the molding apparatus 190 after clamping the workpiece 100 with the first and second mold portions 192 and 194. As the first mold portion 192 moves toward the workpiece 100, the first mold portion 192 and the release tape 196 spread the mold compound 160 across the second surface 134 of the redistribution structure 130 to form a protective layer 162 on the workpiece 100. In the illustrated embodiment, the first interconnect elements 150 are pressed into the release tape 196 such that the release tape 196 deforms and covers at least a section of the distal portion 154 of the individual first interconnect elements 150. As a result, the illustrated protective layer 162 does not cover at least a section of the distal portion 154 of the individual first interconnect elements 150. Rather, the distal portions 154 are at least partially exposed. For example, in one embodiment, the exposed sections of the distal portions 154 project a distance $D_2$ of approximately 40 to 50 microns.

Figure 6:
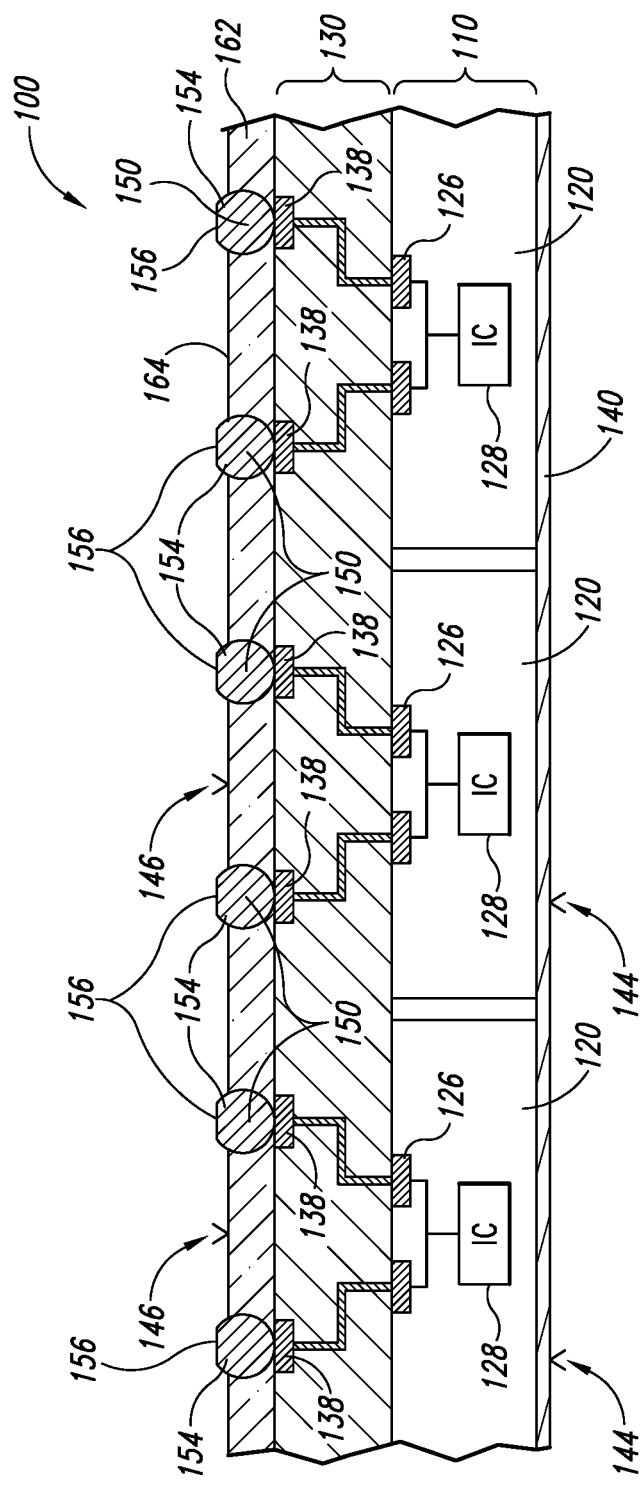

FIG. 6 is a schematic side cross-sectional view of the portion of the semiconductor workpiece 100 after removing the workpiece 100 from the molding apparatus 190. After constructing the protective layer 162, a plurality of optional second alignment features or marks 146 can be formed in and/or on a surface 164 of the protective layer 162. The placement of the second alignment marks 146 can be based on the arrangement of first alignment marks 144 on the protective film 140. The second alignment marks 146 accordingly further facilitate proper alignment of the workpiece 100 during subsequent processing. For example, the second alignment marks 146 may correspond to the position of the terminals 138 on the redistribution structure 130 and assist the processing equipment in properly positioning the workpiece 100 so that a plurality of second interconnect elements (not shown) can be attached to corresponding first interconnect elements 150 and properly aligned with the terminals 138. The second alignment marks 146 may also assist the processing equipment in properly positioning the workpiece 100 for singulation. In other embodiments, the workpiece 100 may not include the second alignment marks 146.

After forming the second alignment marks 146, the first interconnect elements 150 can be reshaped to facilitate attachment of a plurality of second interconnect elements. For example, in the illustrated embodiment, the first interconnect elements 150 are reconfigured such that the individual distal portions 154 have a generally flat surface 156. The generally flat surfaces 156 define a plane that can be spaced apart from or coplanar with the surface 164 of the protective layer 162. The generally flat surfaces 156 can be formed by heating the first interconnect elements 150 and contacting the elements 150 with a press. In the illustrated embodiment, the first interconnect elements 150 are reshaped without removing material from the elements 150 and the protective layer 162. In other embodiments, however, the first interconnect elements 150 can be reshaped with other methods, and/or the reshaped elements may have a different configuration. In additional embodiments, the first interconnect elements 150 may not be reshaped. In either case, the exposed portions of the first interconnect elements 150 can be cleaned (e.g., Ar plasma cleaned) and fluxed before attaching a plurality of second interconnect elements.

Figure 7:
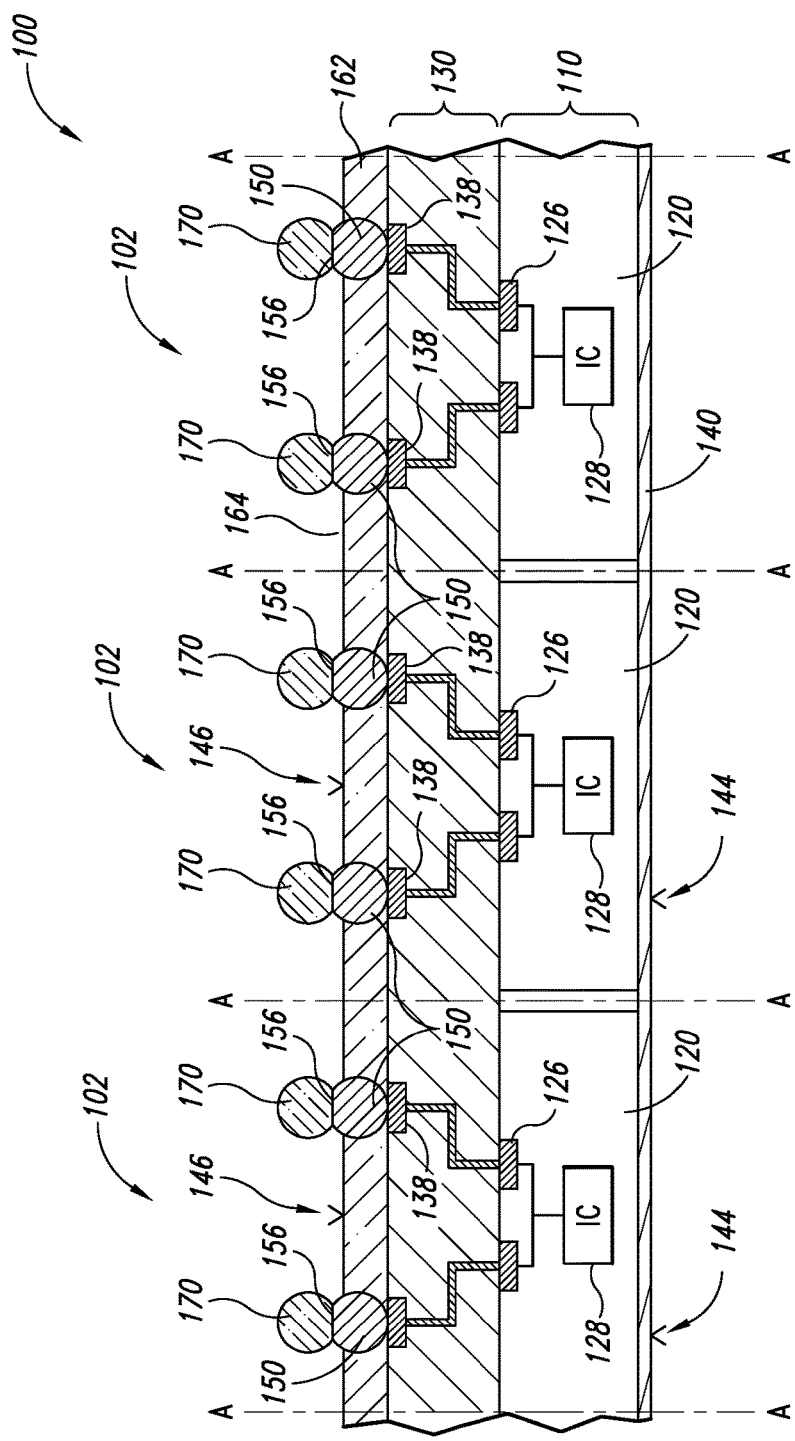

FIG. 7 is a schematic side cross-sectional view of the portion of the semiconductor workpiece 100 after forming a plurality of second interconnect elements 170 on the flat surfaces 156 of corresponding first interconnect elements 150. The second interconnect elements 170 can be aligned with the first interconnect elements 150 based on the first and/or second alignment marks 144 and/or 146. In other embodiments, the second interconnect elements 170 can be aligned with the first interconnect elements 150 via other suitable methods. In either case, after forming the second interconnect elements 170, the semiconductor workpiece 100 can be heated to reflow the first and second interconnect elements 150 and 170 so that the elements 150 and 170 form a robust connection. After reflowing the first and second interconnect elements 150 and 170, the semiconductor workpiece 100 can be cut along lines A-A to singulate a plurality of individual microelectronic devices 102.

Figure 8:
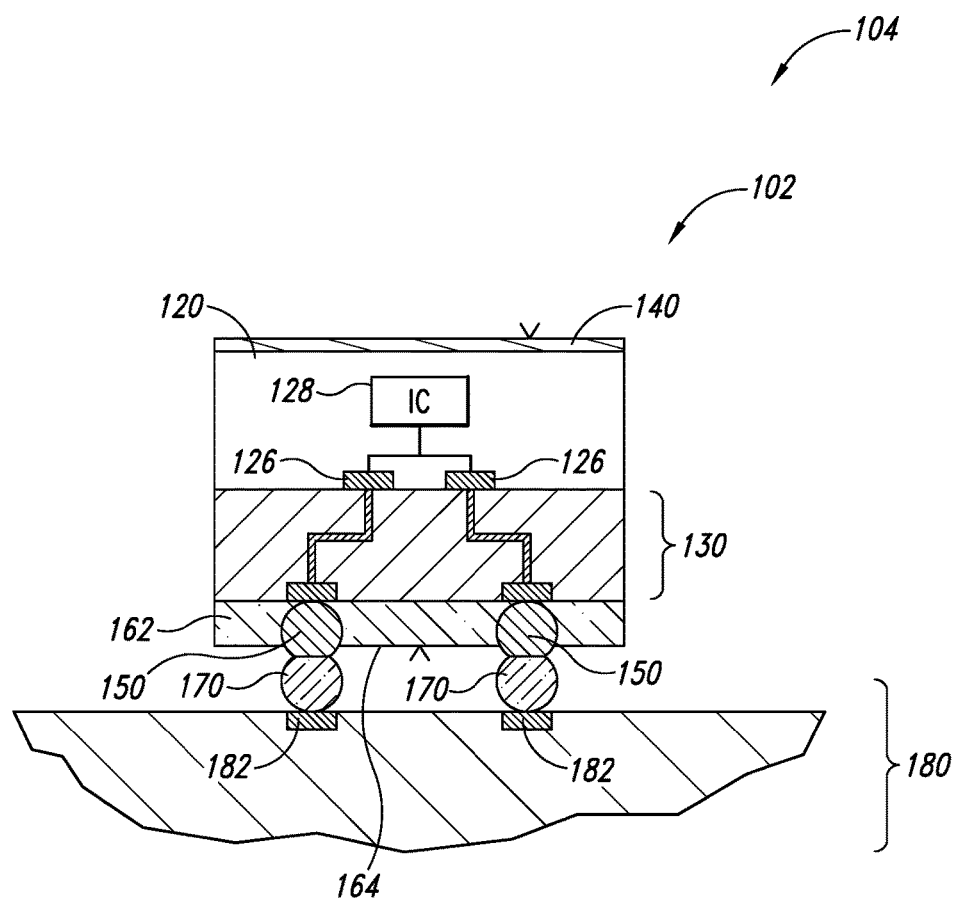
FIG. 8 is a schematic side cross-sectional view of a microelectronic device assembly in accordance with one embodiment of the invention.

FIG. 8 is a schematic side cross-sectional view of a microelectronic device assembly 104 in accordance with one embodiment of the invention. The illustrated device assembly 104 includes a singulated microelectronic device 102 and a substrate 180 attached to the device 102. The substrate 180 can be a printed circuit board or other member having a plurality of pads 182 arranged in an array corresponding to the array of second interconnect elements 170 so that the second interconnect elements 170 can be attached to corresponding pads 182.

The embodiment of the microelectronic device assembly 104 illustrated in FIGS. 1-8 includes stacks of two interconnect elements 150 and 170 connecting the terminals 138 on the microelectronic device 102 to the pads 182 on the substrate 180. The individual stacks of first and second interconnect elements 150 and 170 increase the length of the joint between the microelectronic device 102 and the substrate 180. The increased length of the joint is expected to increase the life of the joint and the microelectronic device assembly 104 because the joint life is related to the von-Mises creep strain energy density and a longer joint reduces the strain energy density in the joint.

The embodiment of the method for manufacturing the microelectronic devices 102 illustrated in FIGS. 1-7 does not need to remove material from the first interconnect elements 150 or the protective layer 162 via grinding or other abrasive techniques. As a result, the first interconnect elements 150 and the protective layer 162 are expected to have greater structural integrity, which increases the yield of the microelectronic devices 102.

The embodiment of the method for manufacturing the microelectronic devices 102 illustrated in FIGS. 1-7 includes optionally forming the first alignment marks 144 on the protective film 140 and the second alignment marks 146 on the protective layer 162. The first and second alignment marks 144 and 146 facilitate alignment of the semiconductor workpiece 100 so that the second interconnect elements 170 can be precisely positioned on corresponding first interconnect elements 150 and the individual microelectronic devices 102 can be accurately singulated. Moreover, the first and second alignment marks 144 and 146 need not be formed in an open space at a specific location on the workpiece 100. As a result, the space available on the workpiece 100 for active devices is increased, and the tooling used in constructing the workpiece 100 need not be modified to construct different microelectronic devices.

The embodiment of the microelectronic device assembly 104 illustrated in FIG. 8 includes a protective layer 162 covering the proximal portions 152 of the first interconnect elements 150 and the surface 164 of the redistribution structure 130. The illustrated device assembly 104 does not include an underfill material between the protective layer 162 of the microelectronic device 102 and the substrate 180. The device assembly 104 need not include an underfill material because the protective layer 162 provides sufficient support to the first interconnect elements 150 and adequate protection to the redistribution structure 130.

In one embodiment, a method of forming a plurality of microelectronic devices on a semiconductor workpiece includes placing a plurality of first interconnect elements on a side of a semiconductor workpiece, forming a layer on the side of the workpiece, reshaping the first interconnect elements by heating the first interconnect elements, and coupling a first portion of a plurality of individual second interconnect elements to corresponding first interconnect elements with a second portion of the individual second interconnect elements exposed.

In another embodiment, a method includes forming a plurality of first interconnect elements on corresponding terminals of a semiconductor workpiece, molding a layer onto the workpiece with the layer covering only a portion of the first interconnect elements, and attaching a plurality of free second interconnect elements to corresponding first interconnect elements.

In another embodiment, a method includes constructing a plurality of first interconnect elements on corresponding terminals of a semiconductor workpiece, reconfiguring the first interconnect elements without removing material from the first interconnect elements, and, after reconfiguring the first interconnect elements, placing a plurality of second interconnect elements on corresponding first interconnect elements. The individual second interconnect elements including a first portion attached to the corresponding first interconnect element and a second portion exposed.

In another embodiment, a method includes constructing a redistribution structure on a first side of a semiconductor workpiece, providing an alignment feature on a second side of the workpiece, forming a plurality of first interconnect elements on the redistribution structure with the first interconnect elements projecting from the redistribution structure, reconfiguring the first interconnect elements, and aligning a plurality of free second interconnect elements with corresponding first interconnect elements based on the alignment feature.

In still another embodiment, a semiconductor workpiece includes a substrate and a plurality of dies formed at the substrate. The individual dies include an integrated circuit and a plurality of terminals operably coupled to the integrated circuit. The workpiece further includes a plurality of first interconnect elements electrically coupled to corresponding terminals, a protective layer having a first surface facing the substrate and a second surface opposite the first surface, and a plurality of stacked second interconnect elements attached to corresponding first interconnect elements. The individual first interconnect elements have a proximal portion proximate to the substrate and a distal portion opposite the proximal portion. The distal portion of the individual first interconnect elements projects from the second surface of the protective layer.

In yet another embodiment, a semiconductor workpiece includes a substrate and a plurality of dies formed at the substrate. The substrate has a first side and a second side opposite the first side. The individual dies include an integrated circuit and a plurality of terminals operably coupled to the integrated circuit. The workpiece further includes a plurality of first interconnect elements at the first side of the substrate and electrically coupled to corresponding terminals, a plurality of stacked second interconnect elements attached to corresponding first interconnect elements, and an alignment feature on the second side of the substrate.

Figure 9:
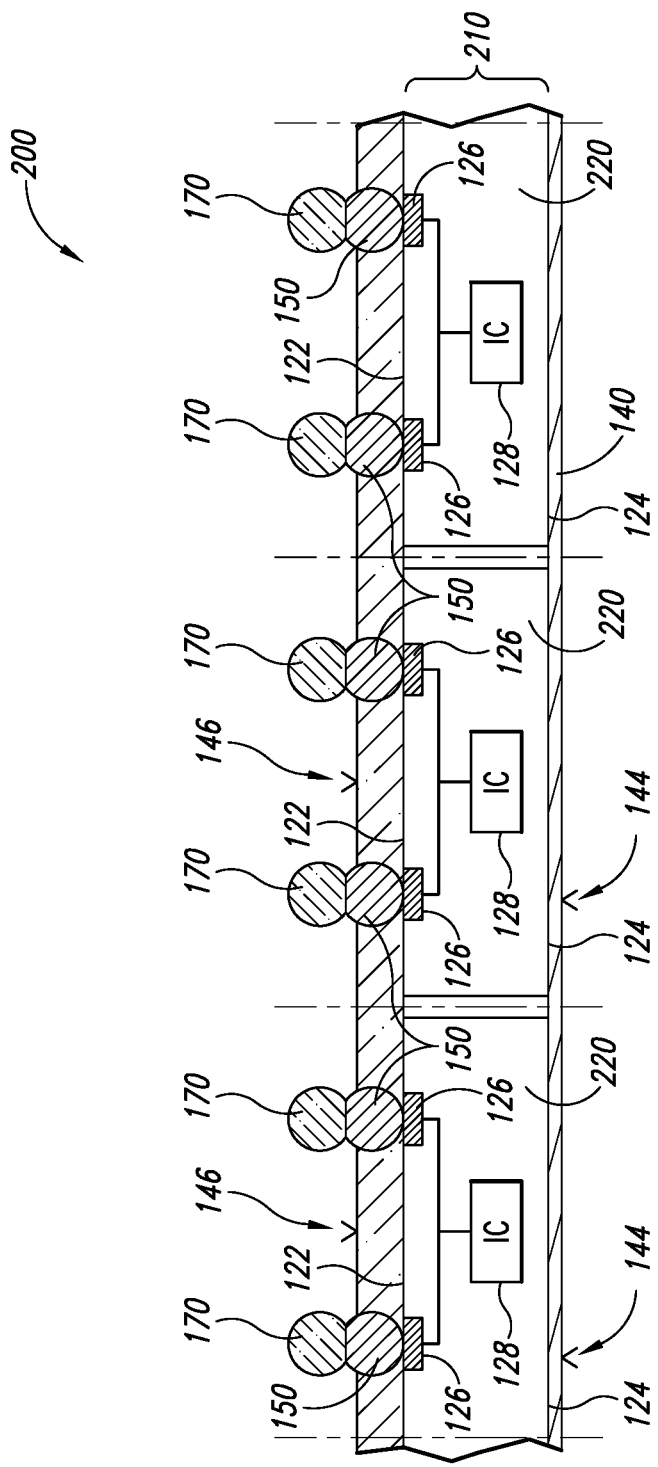
FIG. 9 is a schematic side cross-sectional view of a portion of a semiconductor workpiece in accordance with another embodiment of the invention.

FIG. 9 is a schematic side cross-sectional view of a portion of a semiconductor workpiece 200 in accordance with another embodiment of the invention. The illustrated workpiece 200 is generally similar to the workpiece 100 described above with reference to FIGS. 1-7. For example, the illustrated workpiece includes a substrate 210, a plurality of microelectronic dies 220 formed in and/or on the substrate 210, a plurality of first interconnect elements 150, and a plurality of second interconnect elements 170 attached to corresponding first interconnect elements 150. The illustrated workpiece 200, however, does not include a redistribution structure. Rather, the first interconnect elements 150 are attached directly to the terminals 126 of the microelectronic dies 220. The terminals 126 on the dies 220 are accordingly spaced apart such that the adjacent stacks of first and second interconnect elements 150 and 170 do not contact each other.

Figure 10:
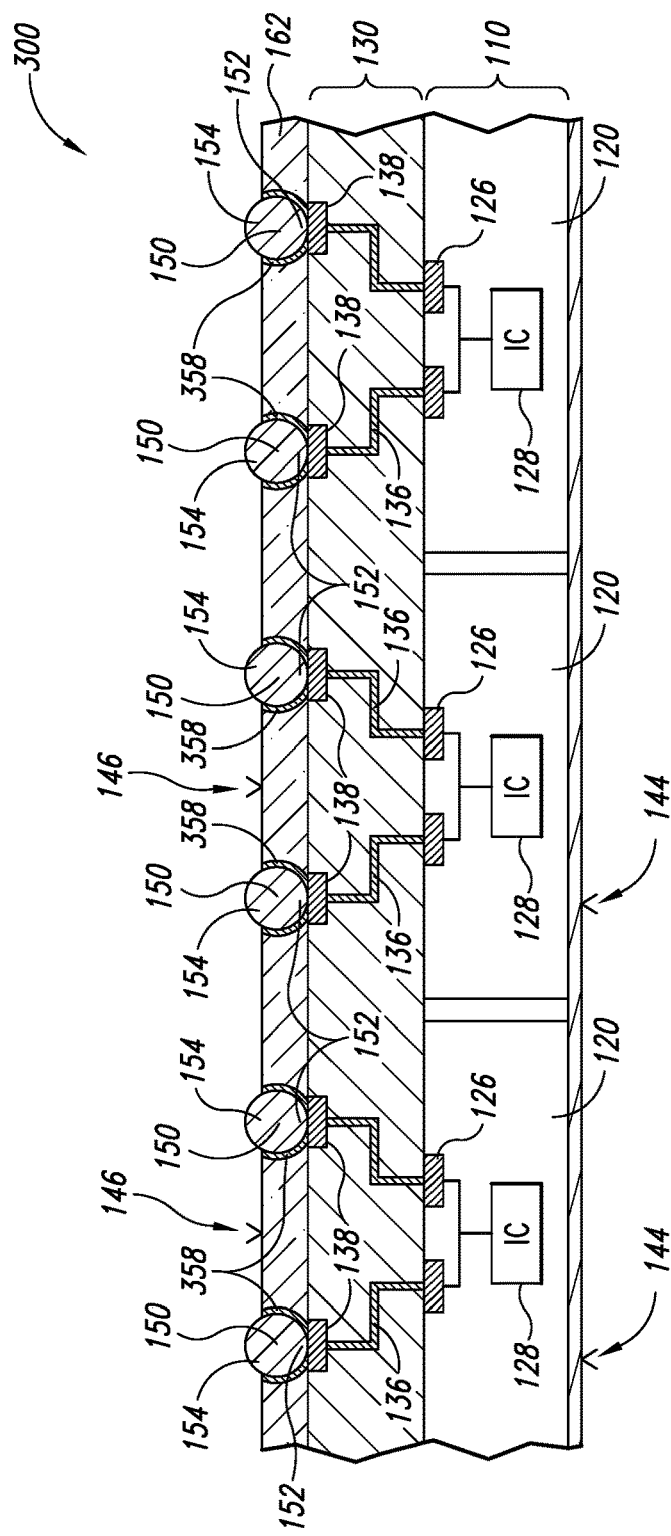
FIG. 10 is a schematic side cross-sectional view of a portion of a semiconductor workpiece in accordance with another embodiment of the invention.

FIG. 10 is a schematic side cross-sectional view of a portion of a semiconductor workpiece 300 in accordance with another embodiment of the invention. The illustrated workpiece 300 is generally similar to the workpiece 100 described above with reference to FIGS. 1-6. For example, the workpiece 300 includes a substrate 110, a plurality of dies 120 formed in and/or on the substrate 110, a redistribution structure 130 formed on the dies 120, and a plurality of first interconnect elements 150 attached to corresponding terminals 138 of the redistribution structure 130. The illustrated individual first interconnect elements 150, however, include a coating 358 covering the proximal portion 152, but not the distal portion 154. The coating 358 can have a first surface tension, and the first interconnect elements 150 can have a second surface tension greater than the first surface tension. The difference in the first and second surface tensions enables the protective layer 162 to be formed by methods other than molding. Specifically, when a flowable compound is deposited onto the redistribution structure 130, the coating 358 inhibits the flowable compound from wicking up the first interconnect elements 150 and covering the distal portions 154. As a result, the protective layer 162 can be formed by spin-on, printing, dispensing, or other suitable methods. In other embodiments, the coating 358 may cover the proximal and distal portions 152 and 154 of the individual first interconnect elements 150. For example, the distal portion 154 of the individual first interconnect elements 150 may be covered with sacrificial coating, and after forming the protective layer 162, the sacrificial coating can be removed with any portion of the protective layer 162 that covers the distal portion 154.

Figure 11:
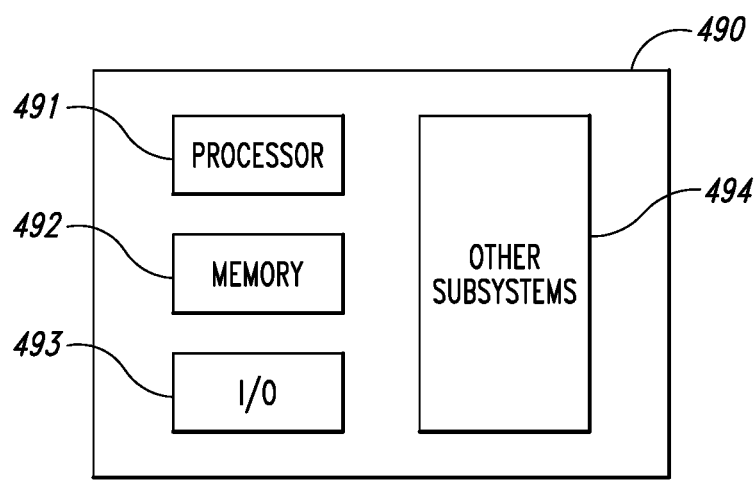
FIG. 11 is a schematic illustration of a system in which the microelectronic devices may be incorporated.

Any one of the microelectronic devices described above with reference to FIGS. 1-10 can be incorporated into any of a myriad of larger and/or more complex systems 490, a representative one of which is shown schematically in FIG. 11. The system 490 can include a processor 491, a memory 492 (e.g., SRAM, DRAM, Flash, and/or other memory device), input/output devices 493, and/or other subsystems or components 494. Microelectronic devices may be included in any of the components shown in FIG. 11. The resulting system 490 can perform any of a wide variety of computing, processing, storage, sensor, imagers and/or other functions. Accordingly, representative systems 490 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini computers. Other representative systems 490 include cameras, light or other radiation sensors, servers and associated server subsystems, display devices, and/or memory devices. In such systems, individual dies can include imager arrays, such as CMOS imagers. Components of the system 490 may be housed in a single unit or distributed over multiple, interconnected units, e.g., through a communications network. Components can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A semiconductor workpiece, comprising:
   a substrate having a first side and a second side opposite the first side;
   a plurality of dies formed at the substrate, wherein individual dies include an integrated circuit and a plurality of first terminals operably coupled to the integrated circuit;
   a redistribution structure over the first side of the substrate, wherein the redistribution structure includes a uniform dielectric layer having a planar first surface extending continuously over substantially an entire width of the substrate, a planar second surface opposite the planar first surface, a plurality of second terminals at the planar first surface, and a plurality of traces extending through the uniform dielectric layer and operably coupling individual second terminals to the integrated circuit via corresponding individual first terminals proximate the planar first surface;
   a plurality of first interconnect elements over the redistribution structure and electrically coupled to corresponding first terminals, wherein individual first interconnect elements include a generally flat distal portion and an outermost surface separated from the planar second surface of the redistribution structure by a first distance;
   a plurality of second interconnect elements attached to corresponding first interconnect elements;
   a protective layer over and separated from the planar second surface of the redistribution structure by a second distance less than the first distance; and
   a coating over a mold compound and extending over the distal portion of the individual first interconnect elements.

2. The semiconductor workpiece of claim 1 wherein the protective layer covers only a portion of the individual first interconnect elements.

3. The semiconductor workpiece of claim 1, further comprising:
   a first alignment features at the second side of the substrate; and
   a second alignment feature at the protective layer.

4. The semiconductor workpiece of claim 1 wherein the generally flat distal portion is at the interface between the first and second interconnect elements.

5. The semiconductor workpiece of claim 1 wherein the first interconnect elements project from corresponding first terminals on the die.

6. The semiconductor workpiece of claim 1 wherein the distal portion includes at least one of a pressed surface or a molded surface.

7. The semiconductor workpiece of claim 1 wherein the generally flat distal portion of the individual first interconnect elements is formed without removing material from the individual first interconnect elements.

8. The semiconductor workpiece of claim 1 wherein the difference between the second distance and the first distance is approximately 40 to 50 microns.

9. A semiconductor workpiece, comprising:
   a substrate having a first side and a second side opposite the first side;
   a plurality of dies formed at the substrate, wherein individual dies include an integrated circuit and a plurality of first terminals operably coupled to the integrated circuit;
   a redistribution structure over the first side of the substrate, wherein the redistribution structure includes a uniform dielectric layer having a planar first surface extending continuously over substantially an entire width of the substrate, a planar second surface opposite the planar first surface, a plurality of second terminals at the planar first surface, and a plurality of traces extending through the uniform dielectric layer and operably coupling individual second terminals to the integrated circuit via corresponding individual first terminals proximate the planar first surface;
   a plurality of first interconnect elements over the redistribution structure and electrically coupled to corresponding first terminals, wherein individual first interconnect elements include a generally flat distal portion, wherein the first interconnect elements extend over the planar second surface of the redistribution structure by a first distance;
   a plurality of second interconnect elements attached to corresponding first interconnect elements;
   a mold compound on the redistribution structure and extending over the planar second surface of the redistribution structure by a second distance less than the first distance; and a release tape on the mold compound, where the release tape is at least partially deformed over and covering the distal portion of the individual first interconnect elements.

* * * * *